United States Patent
Mizunaga (10) Patent No.: US 8,375,884 B2
(45) Date of Patent: Feb. 19, 2013

(54) SUBSTRATE PROCESSING APPARATUS (75) Inventor: Kouichi Mizunaga, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 516 days.

(21) Appl. No.: 12/652,777

(22) Filed: Jan. 6, 2010

(65) Prior Publication Data

US 2010/0199911 A1    Aug. 12, 2010

(30) Foreign Application Priority Data

Feb. 6, 2009   (JP) ................. 2009-025591

(51) Int. Cl.
*B05C 13/02* (2006.01)
(52) U.S. Cl. ........... 118/59; 118/66; 118/52; 118/56; 118/319; 118/320; 118/500; 432/77; 432/82; 432/239
(58) Field of Classification Search ............ 118/59, 118/60, 66, 52, 56, 319, 320, 500; 396/611, 396/572; 438/795; 355/27, 30; 432/239, 432/77, 82; 414/939, 941; 219/390
See application file for complete search history.

(56) References Cited

U.S. PATENT DOCUMENTS

| | | | |
|---|---|---|---|
| 6,309,212 B1 | 10/2001 | Nakazato | |
| 6,391,112 B1 * | 5/2002 | Mahler et al. ............ | 118/500 |
| 6,464,789 B1 | 10/2002 | Akimoto | |
| 6,499,777 B1 * | 12/2002 | Wang ....................... | 294/213 |
| 7,838,801 B2 | 11/2010 | Hirakawa et al. | |

FOREIGN PATENT DOCUMENTS

| | | |
|---|---|---|
| JP | 07-081755 A1 | 3/1995 |
| JP | 11-054428 A1 | 2/1999 |
| JP | 2000-323553 A1 | 11/2000 |
| JP | 2001-057336 A1 | 2/2001 |
| JP | 2007-220983 A1 | 8/2007 |
| JP | 2008-103707 A1 | 5/2008 |

* cited by examiner

*Primary Examiner* — Laura Edwards
(74) *Attorney, Agent, or Firm* — Burr & Brown (57) ABSTRACT

A substrate processing apparatus including: a heating part for heating a wafer; a transport part through which a wafer is transported; a first transfer arm that receives a wafer from the heating part and places the wafer on the transport part; and a second transfer arm including a pair of plate-like tweezers that receives the wafer placed on the transport part from the transport part and transfers the wafer. The transport part includes a cooling plate having a cooling surface on which a wafer is placed. The cooling plate includes a temperature-adjusting channel through which a temperature-adjusting water is circulated for cooling the cooling plate to a temperature lower than a temperature of the heating process of the heating part. The cooling surface is provided with a recess that is similar in shape to and slightly larger than a planar shape of the pair of tweezers.

7 Claims, 10 Drawing Sheets

SUBSTRATE PROCESSING APPARATUS

CROSS REFERENCE TO RELATED APPLICATIONS

This application is based upon and claims the benefit of priority from the prior Japanese Patent Application No. 2009-025591 filed on Feb. 6, 2009, the entire contents of which are incorporated herein by reference.

FIELD OF THE INVENTION

The present invention relates to a processing apparatus for a substrate such as a semiconductor wafer and a glass substrate (FPD substrate) for liquid crystal display.

BACKGROUND ART

A step for forming a resist pattern on a substrate, which is one of processes for manufacturing a semiconductor device and an FPD substrate, is composed of a series of steps in which a resist film is formed on a substrate such as a semiconductor wafer (hereinafter referred to as "wafer"), the resist film is exposed with the use of a photomask, and thereafter a desired pattern is obtained by performing a developing process. These series of steps has been conventionally performed by a coating and developing apparatus.

For example, a wafer, which has been subjected to a developing process by the developing apparatus, is subjected to a post-baking process, and a resist pattern is formed by developing. Thereafter, a developing liquid and a rinse liquid remaining in the resist film or on a surface thereof are evaporated and removed. This is a thermal process for hardening the resist and for reinforcing contact between the resist and the wafer. This thermal process if performed at a temperature of, e.g., 130° C. to 200° C.

After completion of the post-baking process, the wafer is returned to a cassette (FOUP) of a cassette station. The wafer, which has been processed at a high temperature, is taken out by a heating apparatus, and is housed into the cassette (FOUP) with such a high temperature. In this case, there are problems of heat accumulation in the cassette (FOUP) and/or warp of the wafer caused by a non-uniform temperature decrease in the cassette.

In order to solve the problems, there is conventionally disposed a cooling table (TCP) through which a wafer is transported, between a cassette station and a process station. The cooling table has a plurality of support pins for supporting a substrate thereon, the support pins being capable of being driven by a cylinder or the like. A cooling water circulates inside the cooling table, whereby a substrate placed on the cooling table can be cooled to a predetermined temperature (see, Patent Document 1, for example).

According to the technique described in Patent Document 1, when a wafer of a high temperature which has been subjected to a post-baking process is returned from the process station to the carrier station, the wafer is passed through the transport cooling table so as to decrease the temperature of the wafer. Then, the wafer is housed into the cassette.

In the invention described in Patent Document 1, a resist liquid is applied to a wafer, a circuit pattern of the wafer is exposed by an exposure device, and then the wafer is received by an interface part. Then, after the wafer has been transported to the process station, the wafer is subjected to a heating process. At this time, there is a case in which a cooling apparatus, which is provided in a group G4 of processing apparatuses that are longitudinally arranged, is used as a transport table. In this case, temperatures of the wafers passing through the cooling apparatus are previously adjusted to be uniform, and the wafers are subjected to a process performed by a subsequent processing part.

[Patent Document]
Patent Document: JP11-54428A (paragraph 0027, and FIGS. 1 and 3 to 7)

However, in accordance with the higher efficiency of a process of a processing unit and the acceleration in a processing speed of a transfer apparatus, a recent coating and developing apparatus of a high productivity has to correspond to an exposing apparatus coping with the high productivity, for example, a system capable of processing wafers at a high speed, e.g., capable of processing 180 to 250 wafers per hour. Thus, a lot of efforts are made to reduce a useless time as much as possible.

In the structure of the transport cooling apparatus described in Citation 1, when a wafer is transported to an arm of a transfer apparatus to the cooling table, the wafer is once held by three support pins, and then the wafer is moved downward and cooled. The arm of the transfer apparatus to which the wafer is transferred receives the wafer, which is waiting the timing after it has been cooled and raised by the support pins.

Thus, when the structure described in Patent Document 1, it is necessary to increase the numbers of wafers to be placed on the cooling table, in order to improve the productivity. This requires a lot of reconsiderations of a force for a cooling water and moving axes of the transfer apparatus, and solutions for acquiring a space in which the wafers can be placed.

DISCLOSURE OF THE INVENTION

The present invention has been made in view of the above circumstances. The object of the present invention is to provide, in a system of a high productivity, a substrate processing apparatus capable of reducing an unnecessary time, having a function for transporting a substrate, and promptly decreasing a high temperature of a substrate to a predetermined temperature.

The present invention is a substrate processing apparatus comprising: a heating part configured to subject a substrate to a heating process; a transport part through which a substrate is transported; a first substrate transfer means; and a second substrate transfer means having a plate-like substrate holding part; wherein the substrate, which has been subjected to the heating process by the heating part, is received and placed on the transport part, by one of the first substrate transfer means and the second substrate transfer means, the substrate placed on the transport part is received from the transport part and transferred, by the other of the first substrate transfer means and the second substrate transfer means, and the transport part includes: a table having a cooling surface on which the substrate is placed; a temperature-adjusting channel disposed in the table, through which a temperature-adjusting water is circulated for cooling the table to a temperature lower than a temperature of the heating process; and a recess formed in the cooling surface of the table, the recess having a shape that is similar to a planar shape of the substrate holding part of the second substrate transfer means and slightly larger than the planar shape of the substrate holding part; wherein the recess has such a depth and such a width that the substrate holding part of the second transfer means is not allowed to come into contact with the substrate, when the substrate holding part enters the recess with the substrate being placed on the table.

According to the structure as described above, when a substrate is transported between the substrate transfer means and the substrate transport part, the substrate can be directly placed on the cooling surface of the table, without a transport operation performed by the substrate support pins which have been conventionally used. Thus, a time required for cooling the heated substrate can be reduced.

The present invention is the substrate processing apparatus wherein the substrate held by the substrate holding part of the second transfer means is moved above the recess up to a position where the substrate holding part substantially corresponds to the recess, and then the substrate held by the substrate holding part is moved downward so that the substrate is placed on the table.

According to the structure as described above, a wafer can be directly transported, without a transport operation performed by the conventional-type support pins.

The present invention is the substrate processing apparatus wherein the second substrate transfer means is moved such that the substrate holding part enters a space between the substrate placed on the table and the recess, and the substrate holding part is moved upward so that the substrate is received by the substrate holding part.

According to the structure as described above, after the substrate holding part of the second substrate transfer means has entered the recess of the cooling surface of table on which the substrate has been already placed, up to a position where the substrate holding part can receive the substrate without contacting the cooling surface of the recess, the substrate holding part can be moved upward from this condition to as to receive the substrate. Thus, the substrate can be promptly received by the substrate holding part.

The present invention is the substrate processing apparatus wherein the first substrate transfer means includes a plurality of substrate supporting parts for supporting a periphery of the substrate so as to hold the substrate, and the table includes cutouts formed in a peripheral portion of the table, the cutouts allowing the substrate supporting parts to pass therethrough in an up and down direction.

According to the structure as described above, when a substrate, which has been processed and received by the first substrate transfer means, is placed on the table, it is unnecessary to use the substrate support pins. Thus, a time required for the transport operation can be reduced.

The present invention is the substrate processing apparatus wherein the table includes a suction hole for sucking the substrate when the substrate is placed on the table.

According to the structure as described above, since the substrate is sucked so as to be brought into tight contact with the cooling surface, the cooling process itself can be accomplished at a short period of time.

The present invention is the substrate processing apparatus wherein a gas channel through which a gas flows is disposed inside the table, and a plurality of gas discharge holes in communication with the gas channel are formed along a wall surface of the recess, the gas discharge holes being configured to discharge a gas for cooling a substrate placed on the table.

According to the structure as described above, when the substrate is placed on the table, a time required for adjusting the temperature of the substrate can be prevented from being prolonged due to the recess. In this case, since there flows a gas whose temperature has been adjusted by a channel of a temperature-adjusting water such that the gas has the same temperature as the target temperature, the substrate can be cooled by positively discharging the cooled gas toward the recess with which the substrate is not in contact.

The present invention is the substrate processing apparatus wherein the temperature-adjusting channel is disposed adjacent to the gas channel, and a temperature of the gas circulating through the gas channel is adjusted by the temperature-adjusting water circulating through the temperature-adjusting channel.

According to the structure as described above, the temperature of the temperature-adjusting fluid can be effectively transferred to the gas.

The present invention is the substrate processing apparatus wherein when a gas is discharged from the gas discharge holes, the substrate is sucked by the suction hole.

According to the structure as described above, while the substrate is sucked, since a flowrate of the cooling gas can be increased, a time required for cooling the substrate can be reduced, as well as formation of cooling spots can be restrained.

The present invention is the substrate processing apparatus wherein the heating part performs a heating process after a developing process or a heating process after a film formation and coating process.

According to the structure as described above, in the heating process after a developing process, the substrate has a high temperature in order to dry moisture on the substrate surface and to further harden a pattern to be formed. At this time, since the temperature of the substrate can be rapidly decreased for a short period of time, the substrate can be returned to a substrate housing part in the succeeding step, whereby an throughput can be enhanced as a whole.

In the present invention, when a substrate is transported to a transport part with the use of two substrate transfer means of different shapes, it is not necessary, before a cooling process, to temporarily place the substrate on the substrate support pins which have been conventionally used during the transport operation. Thus, a reduction in throughput can be achieved. In addition, since the cooling surface sucks the substrate by the suction means, a time required for cooling the substrate can be reduced. Therefore, productivity of the overall apparatus can be improved.

EMBODIMENT FOR CARRYING OUT THE INVENTION

An embodiment of the present invention will be described herebelow with reference to the attached drawings. Given herein as an example to describe the present invention is a case where a substrate processing apparatus according to the present invention is applied to a coating and developing apparatus for semiconductor wafers.

Figure 8:
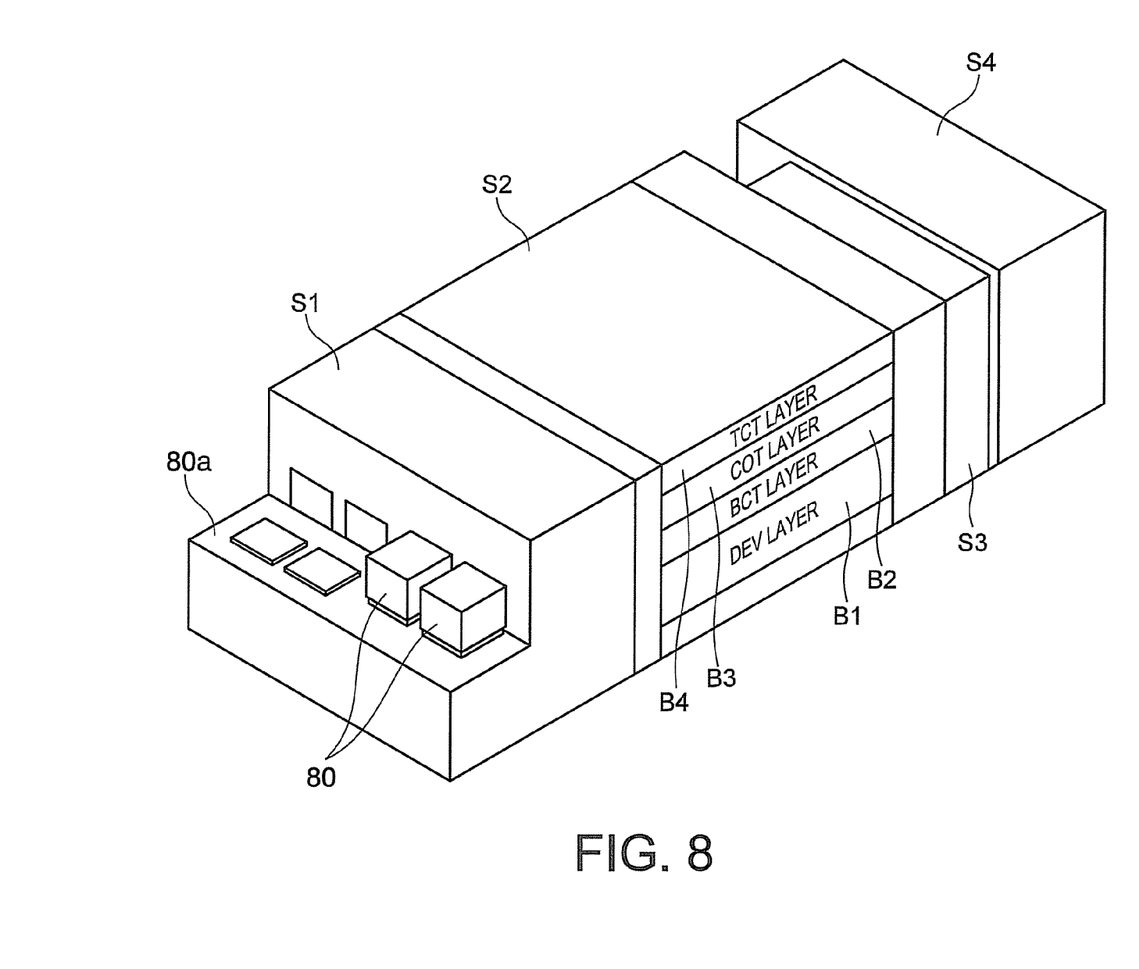
FIG. 8 is a perspective view of the coating and developing apparatus.
Figure 9:
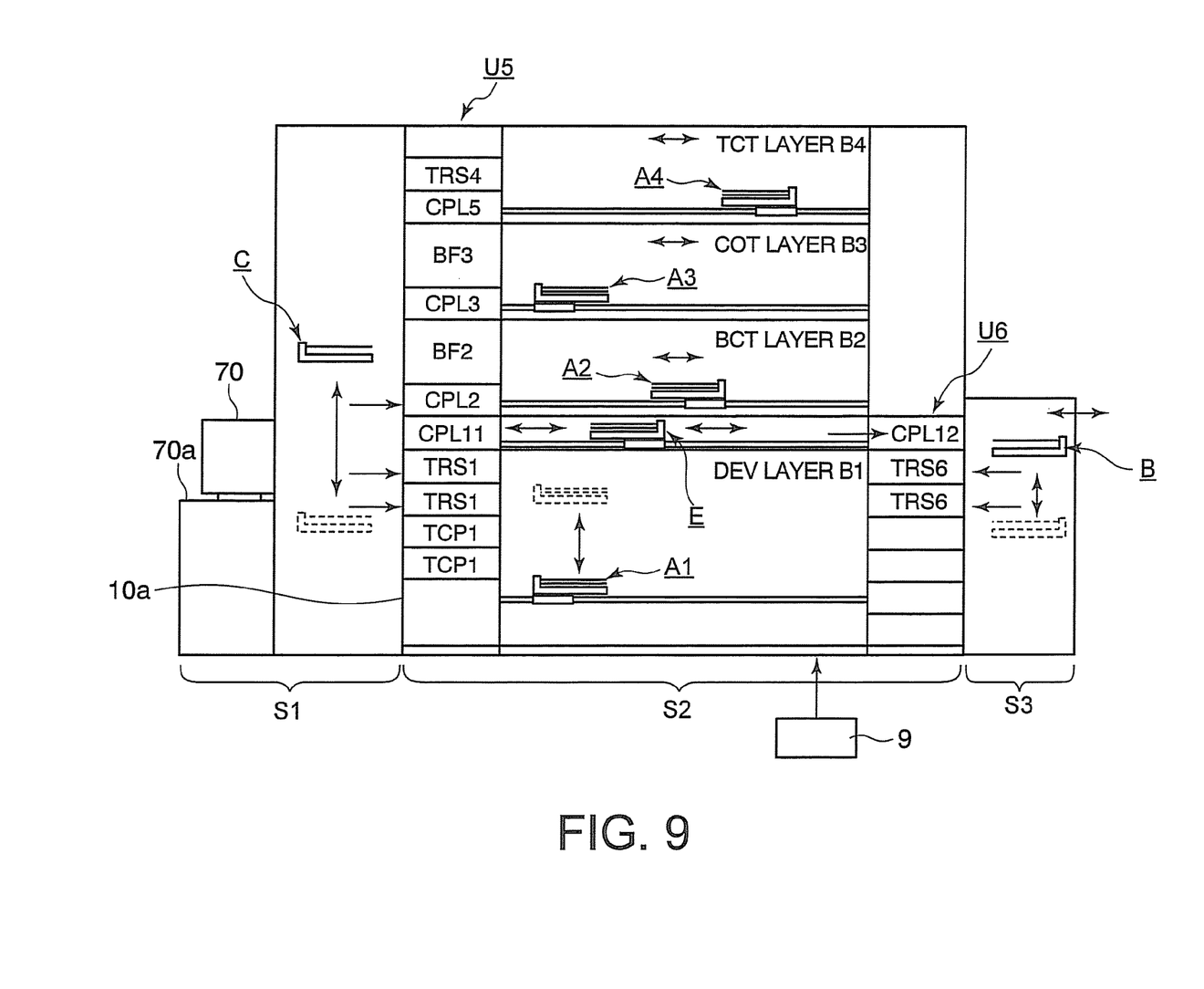
FIG. 9 is a longitudinal sectional view of the coating and developing apparatus.

As shown in FIGS. 8 and 9, the coating and developing apparatus includes a carrier block S1 provided with a table 80a. From a carrier 80 which is a sealable-type substrate container placed on the table 80a, a transport arm C which is a second substrate transfer means takes out a wafer W and transports the wafer W to a processing block S2. Then, the transport arm C receives a processed wafer W from the processing block S2 and returns the wafer W to the carrier 80.

As shown in FIG. 8, the processing block S2 includes a first block (DEV layer) B1, a second block (BCT layer) B2, a third block (COT layer) B3, and a fourth block (TCT layer) B4, which are stacked on each other. The first block (DEV layer) B1 is a block for performing a developing process. The second block (BCT layer) B2 is a block for forming an anti-reflection film, which is to be formed below a resist film. The third block (COT layer) B3 is a block for coating a resist film. The fourth block (TCT layer) B4 is a block for forming an anti-reflection film, which is to be formed above a resist film.

The second block (BCT layer) B2 and the fourth block (TCT layer) B4 are of the same structure. Each of the second block (BCT layer) B2 and the fourth block (TCT layer) B4 includes: a coating unit 1 that coats a chemical liquid for forming an anti-reflection film by spin coating; a processing unit group composed of heating and cooling systems for performing a pre-process and a post-process of a process performed by the coating unit 1; and a transfer arm A2 or A4 disposed between the coating unit 1 and the processing unit group, for transporting a wafer W therebetween. The third block (COT layer) B3 has the same structure as that of the second block B2 or the fourth block B4, except that a resist liquid instead of the chemical liquid is supplied by the third block B3.

The first block (DEV layer) B1 is described with reference to FIG. 9. As shown in FIG. 9, inside the one DEV layer 131, developing units are stacked on each other at two levels. Further, in the DEV layer B1, there is disposed a transfer arm A1 which is a first transfer means for transferring a wafer W to the two developing units. Namely, the transfer arm A1 is common to the two developing units.

Figure 7:
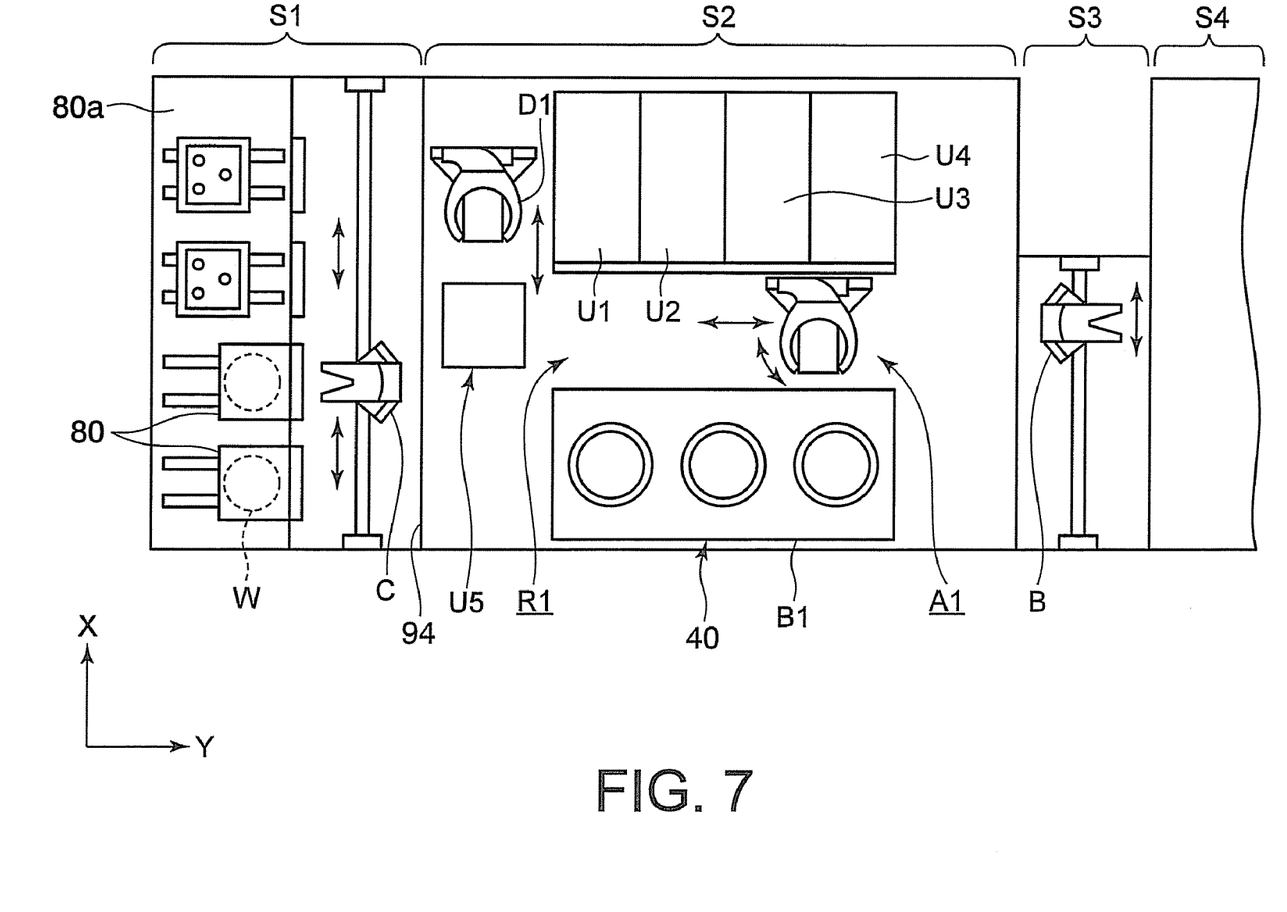
FIG. 7 is a plan view showing an embodiment of a coating and developing apparatus to which a coating unit is applied.

As shown in FIGS. 7 and 9, the processing block S2 includes a shelf unit U5. A wafer W from the carrier block S1 is transported by the transport arm C to one transport unit TRS1 (transition stage) of the shelf unit U5, and is then transferred to a corresponding cooling unit CPL2 (cooling plate) of the second block (BCT layer) B2 by a transport arm D1 disposed near to the shelf unit U5, the transport arm D1 being capable of moving upward and downward. The transfer arm A2 in the second block (BCT layer) B2 receives the wafer W from the cooling unit CPL2, and transfers the wafer W to the respective units (an anti-reflection film unit and the processing unit group composed of heating and cooling systems). In these units, an anti-reflection film is formed on the wafer W.

Thereafter, the wafer W is loaded into the third block (COT layer) B3, via a transport standby unit BF2 of the shelf unit U5, the transport arm D1, a cooling unit CPL 3 (cooling plate) of the shelf unit U5, and a transfer arm A3. In the third block B3, a resist film is formed on the wafer W. In addition, the wafer W is transported to a transport cooling unit CPL11 (cooling plate) of the shelf unit U5, via the transfer arm A3, a transport cooling standby unit BF3 of the shelf unit U5, and the transport arm D1, in this order. Then, in order to deliver the wafer W to an interface arm B that transports a wafer W to and from an exposure apparatus S4, the wafer W in the transport cooling unit CPL 11 is transported by a shuttle arm E to a transport cooling unit CPL12 (cooling plate) of a shelf unit U6.

There is a case in which another anti-reflection film is further formed on the wafer W, on which a resist film has been formed, in the fourth block (TCT layer) B4. In this case, the wafer W is transported to the transfer arm A4 via a cooling unit CPL5 (cooling plate). After an anti-reflection film has been formed on the wafer W, the wafer W is transported to a transport unit TRS4 by the transfer arm A4, and is then transported to the transport cooling unit CPL11. Each of the transport units equipped with the transport standby unit BF serves also as a buffer unit in which a plurality of wafer W can be placed.

Then, the wafer W, which has been directly transferred to the transport cooling unit CPL12 of the shelf unit U6, is taken by the interface block S3 and is then transported to the exposure apparatus S4. That is to say, the wafer W is transferred to the exposure apparatus S4 by the interface arm B which is a transfer apparatus having the same structure as that of the first transfer apparatus. After the wafer W has been subjected to a predetermined exposure process in the exposure apparatus S4, the wafer W is placed on a transport unit TRS6 (transition stage) of the shelf unit U6, and is returned to the processing block S2. The returned wafer W is subjected to a heating process before development (post-exposure baking process) at a temperature of, e.g., 100° C. in the first block (DEV layer) B1, and is then subjected to a developing process. After that, the wafer W is subjected to a heating process (post baking process) after a developing process, at a temperature of, e.g., 160° C. Thereafter, the wafer W is transported by the transfer arm A1 to a TCP1 (transition chill plate) which is a cooling apparatus disposed in the shelf unit U5, and is then housed into the carrier. The TCP1 has structure which enables a wafer W to be transported to and from the transfer means of different kinds.

Following thereto, the wafer W is subjected to a cooling process for decreasing the temperature of the wafer W to a trouble-free temperature, e.g., 30° C. or less, and then the transport arm C receives the wafer W. After that, the wafer W is returned to the carrier 80 by the transfer arm C. In FIG. 7, the reference numbers U1 to U4 respectively depict unit groups of heating apparatuses formed by stacking heating parts and cooling parts on each other.

Figure 1:
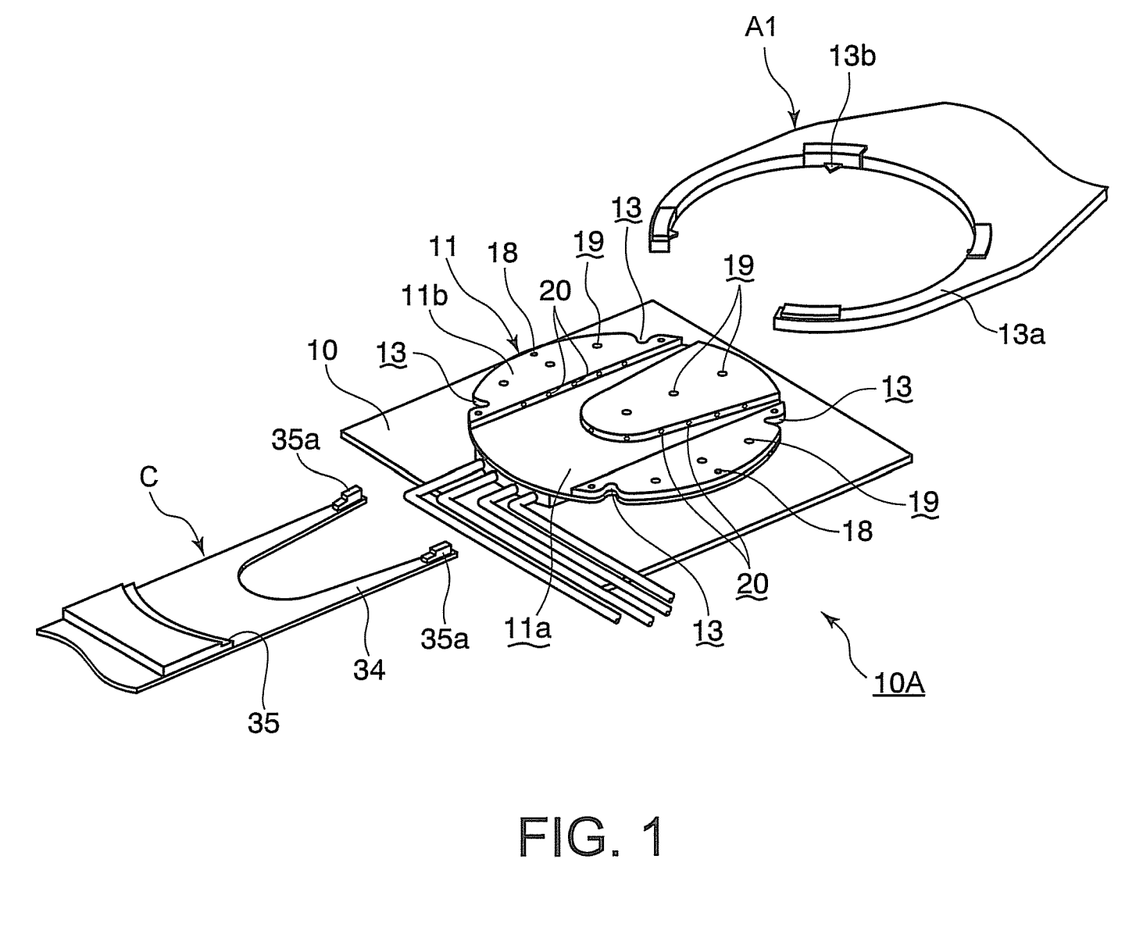
FIG. 1 is a schematically perspective view showing a main part of a substrate processing apparatus according to the present invention.
Figure 2A:
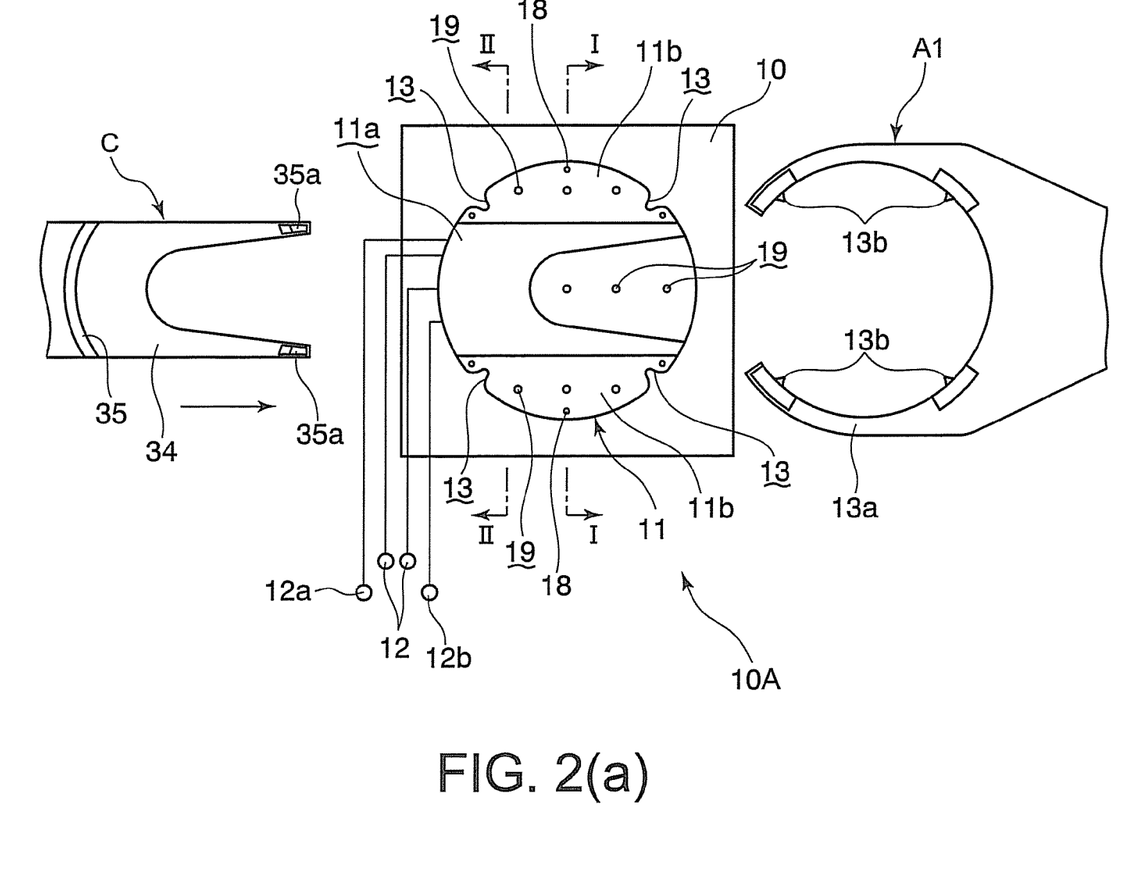
FIG. 2(a) is a plan view showing the main part of the substrate processing apparatus according to the present invention.
Figure 2B:
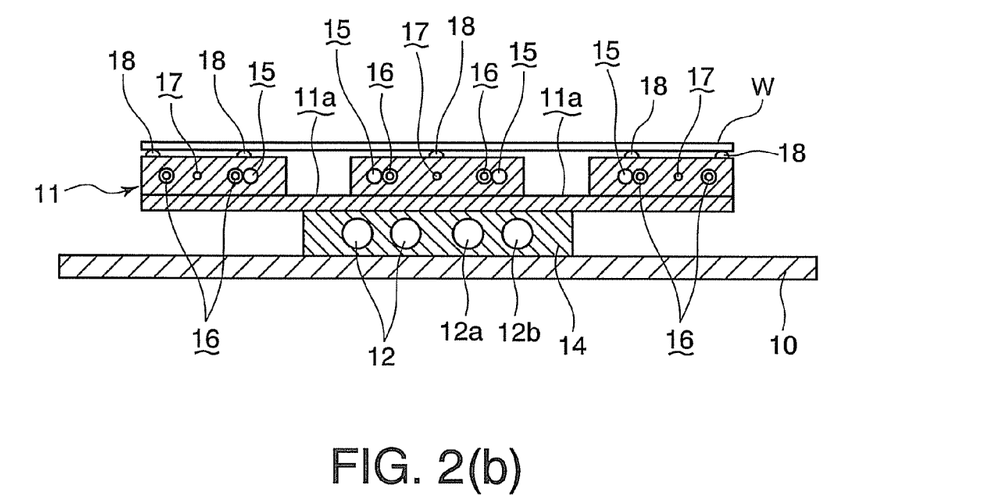
FIG. 2(b) is a sectional view taken along the line I-I of FIG. 2(a).
Figure 2C:
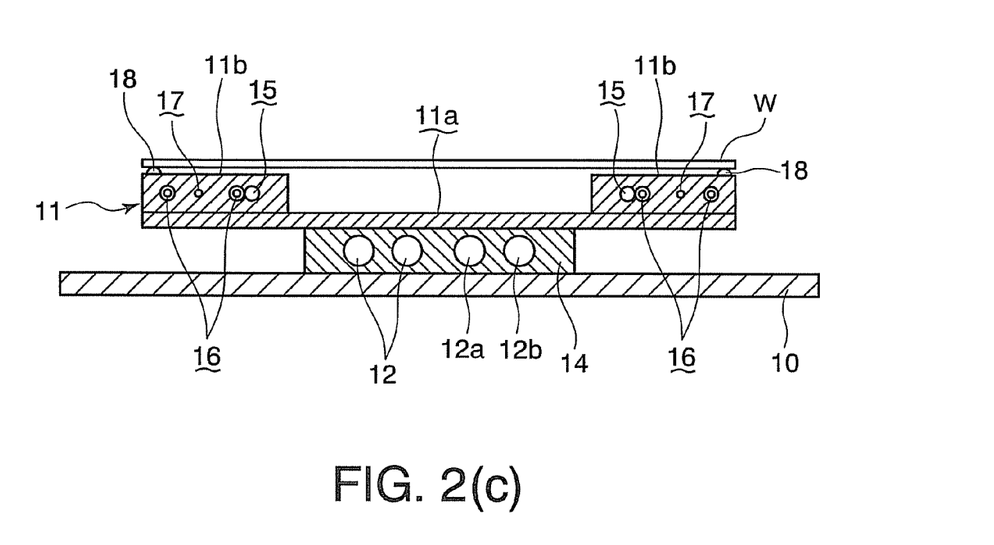
FIG. 2(c) is a sectional view taken along the line II-II of FIG. 2(a).
Figure 3:
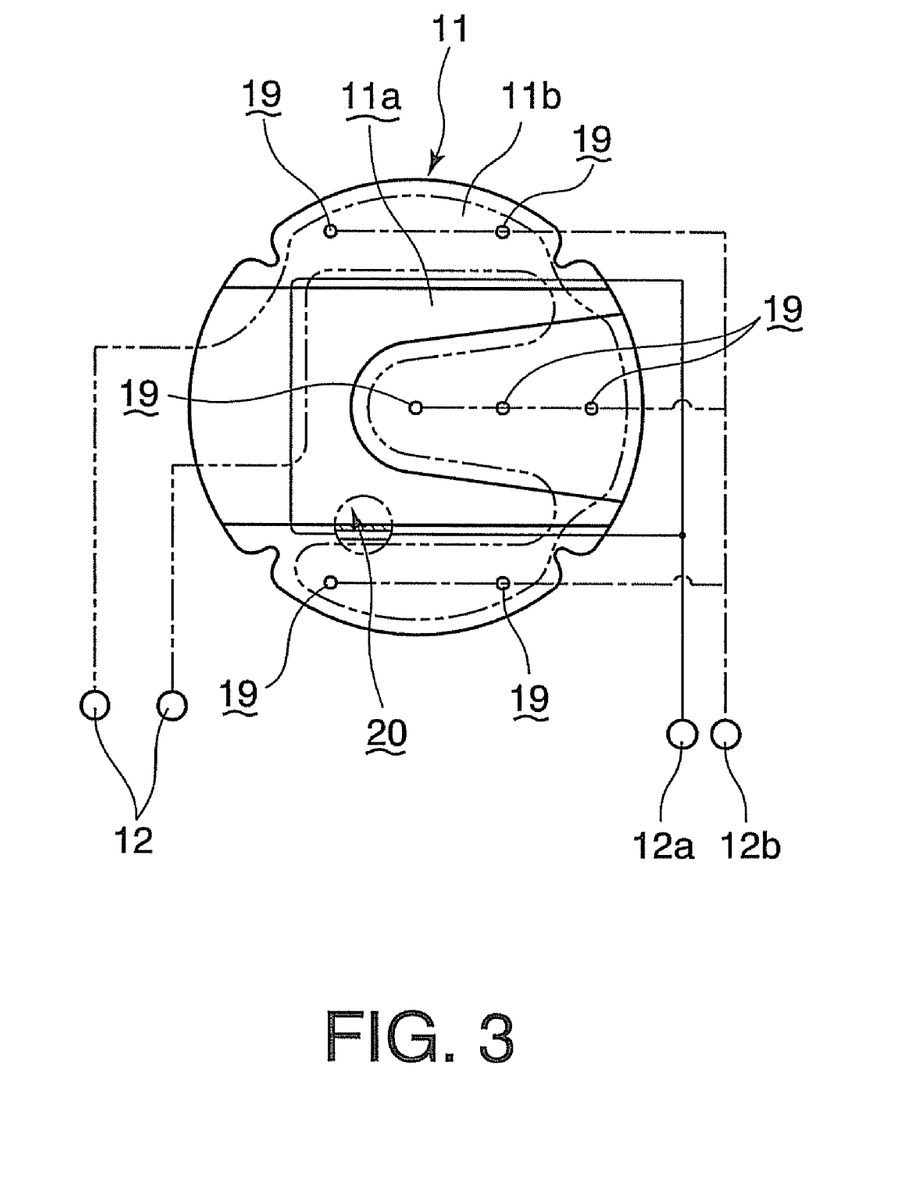
FIG. 3 is a structural view of a cooling plate disposed in the substrate processing apparatus.

Next, there is described the embodiment in which the substrate processing apparatus according to the present invention is applied to a coating and developing apparatus, with reference to FIGS. 1 to 3. The outline of the structure of a substrate cooling apparatus in this embodiment is firstly described. FIG. 2(a) is a schematic plan view of the substrate processing apparatus disposed in the shelf unit U5. FIGS. 2(b) and 2(c) are sectional views taken along the line I-I and the line II-II of FIG. 2(a), respectively. FIG. 3 is a structural view for explaining details of a cooling plate 11 of the substrate processing apparatus, on which a wafer W can be placed and cooled.

As shown in FIG. 2(a), the TCP1 which are the substrate processing apparatuses in this embodiment are stacked in a shelf unit U5. Each TCP1 includes a cooling plate 11 serving as a table, and a base plate 10 on which the cooling plate 11 can be horizontally placed. The cooling plate 11 and the base plate 10 constitute a transport part 10A. The cooling plate 11 has a thickness of, e.g., 15 mm, and is made of a heat transfer material such as stainless and aluminum. As shown in the sectional views of FIGS. 2(b) and 2(c), the cooling plate 11 has a recess 11a of e.g., 7 mm in depth, and a cooling surface 11b on which a wafer W can be placed. Inside the cooling plate 11, there are provided a temperature-adjusting channel 16 through which a temperature-adjusting medium liquid is circulated, and a gas channel 15. In addition, the cooling plate 11 is provided with a suction channel 17 for sucking a wafer W to the cooling plate 11 when a wafer W is placed thereon.

On the surface (cooling surface 11b) of the cooling plate 11 on which a wafer W can be placed, there are disposed a plurality of gap spacers 18 on which a wafer W can be held with a slight clearance of, e.g., 100 μm between the surface and the wafer W, a plurality of suction holes 19 connected to the suction channel 17, and a plurality of gas discharge holes connected to the gas channel 15.

Further, cutouts 13 are formed in a periphery of the cooling plate 11 at a plurality of, e.g., four positions. Due to the cutouts 13, when a substrate holding part 13a is moved in an up and down direction, substrate supporting parts 13b of the substrate holding part 13a of the transfer arm A1 can pass without interference between the substrate supporting parts 13b and the cooling plate 11. The transfer arm A1 functions as a first substrate transfer means.

Interposed between the cooling plate 11 and the base plate 10 is a plate support 14 made of a heat insulation member having a thickness of, e.g., about 40 mm, for maintaining the cooling plate 11 at a higher level. When a wafer W on the transfer arm A1 is transported to the cooling plate 11, the transfer arm A1 is moved downward from the front side of the cooling plate 11 to the rear side thereof. After the transport of the wafer W has been completed, the substrate holding part 13a can be returned to a home position, without being brought into contact with the rear surface of the cooling plate 11 and the base plate 10 by means of the plate support 14. In addition, the plate support 14 is provided with a duct port 12 for letting in and out a temperature-adjusting fluid, a duct port 12a for letting in a gas, and suction duct port 12b. The duct ports 12, 12a, and 12b are connection ports connected to ducts for the various channels (the gas channel 15, the temperature-adjusting channel 16, and the suction channel 17) disposed in the cooling plate 11, and are connected to a temperature-adjusting medium circulation line and a factory-side supply system line, which are not shown.

Figure 4:
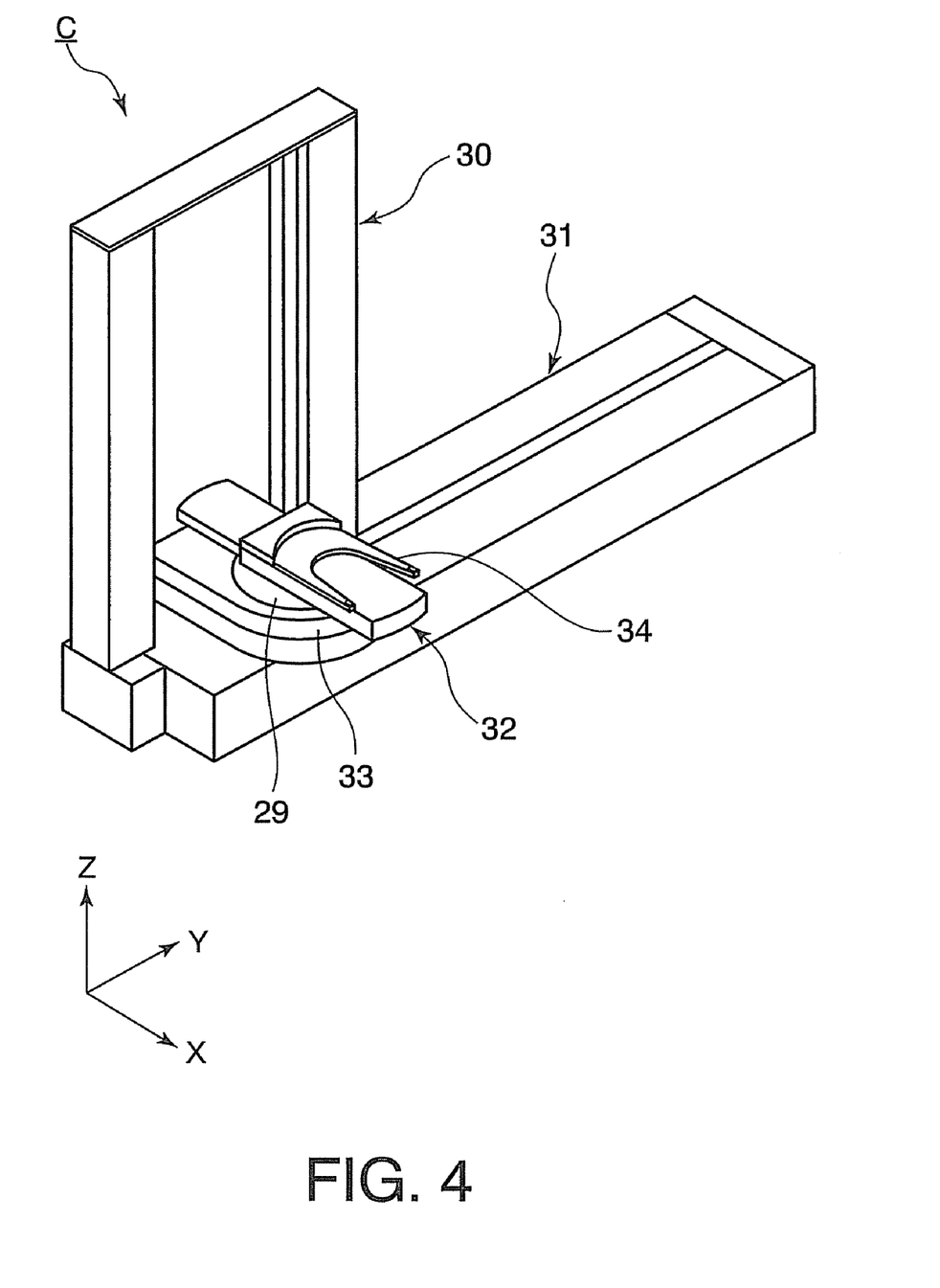
FIG. 4 is a perspective view of a substrate transfer apparatus of a carrier station.
Figure 5A:
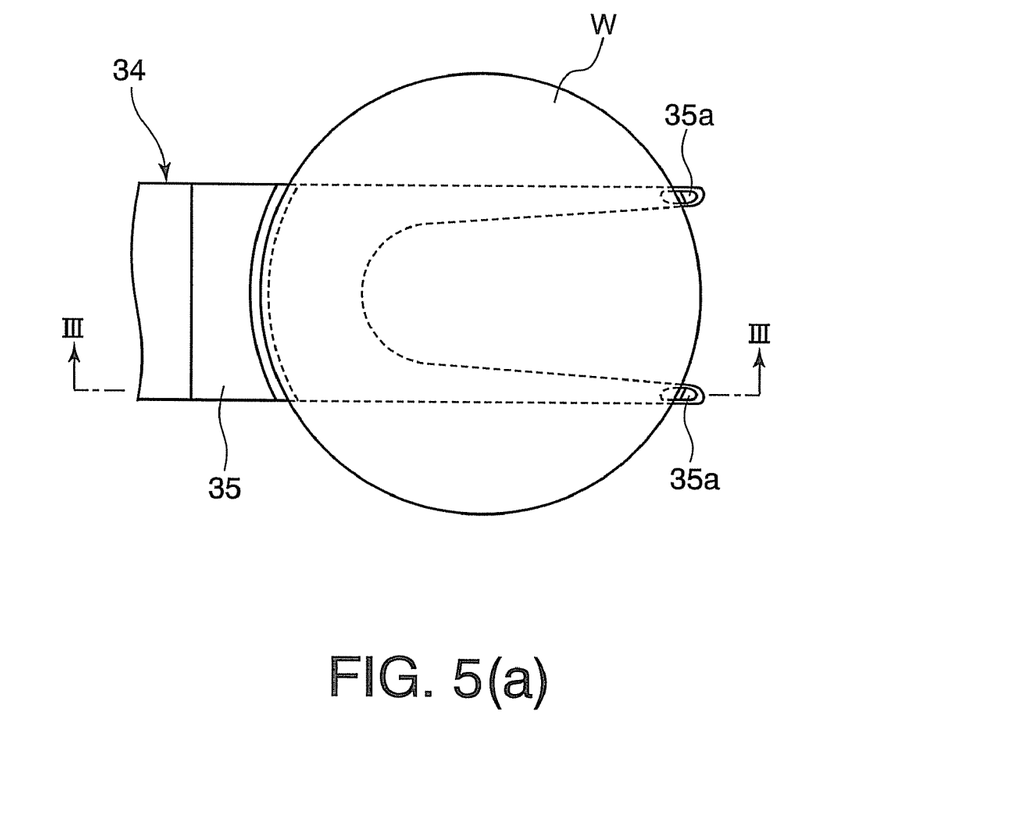
FIG. 5(a) is a plan view of a pair of tweezers of a transport arm.
Figure 5B:
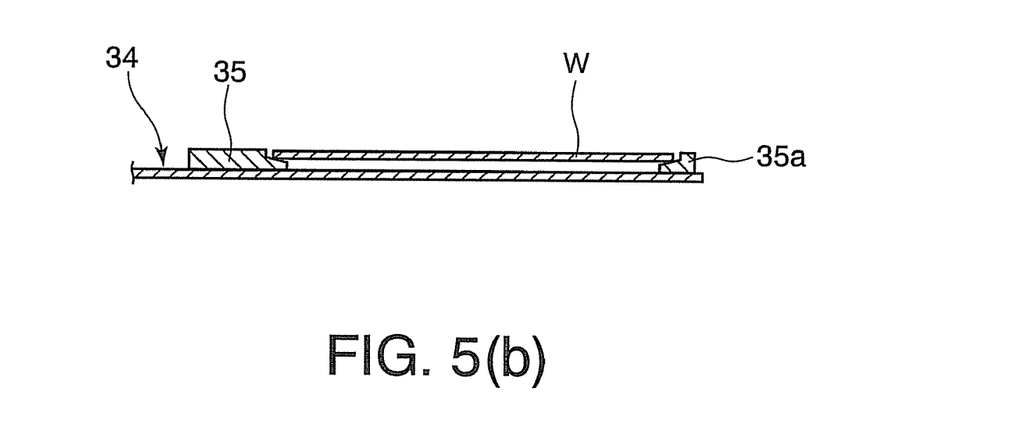
FIG. 5(b) is a side view of the pair of tweezers of the transport arm.

Next, the transport arm C is described with reference to FIGS. 4 and 5, and the transport of a wafer W by the different substrate transfer apparatuses in the substrate processing apparatus of the present invention is described with reference to FIG. 6. FIG. 4 shows a second substrate transfer apparatus provided in the carrier block S1. The transport arm C includes a transfer base table 29, an X-axis base 32 movably disposed on the transfer base table 29 in a forward and rearward direction, and a pair of tweezers 34 of a substantially Y-shape, which is a substrate holding part disposed on the X-axis base 32. The transfer base table 29 can be rotated by a rotational shaft part 33 in the horizontal direction. The transfer base table 29 is connected to a Z-axis base 30 so that the transfer base table 29 can be moved in the up and down direction. In addition, the transfer base table 29 can be moved in a transverse direction by a Y-axis base 31 allowing a transverse movement. In the present invention, in order to transport a wafer W, the pair of tweezers 34 is moved forward and rearward with respect to the cooling plate 11. FIG. 5(a) shows that a wafer W is held by the pair of tweezers 34, in which the wafer W is placed and held between a substrate placing part 35 of an arcuate plan shape, which is positioned on a proximal portion of the pair of tweezers 34, and substrate placing pieces 35a which are positioned on a distal portion thereof. FIG. 5(b) is a sectional view taken along the line of FIG. 5(a).

Next, the cooling process is described in detail with reference to FIG. 6, showing a condition where a wafer W is transported between the different transfer apparatuses via the cooling plate 11. Firstly, as shown in FIG. 6(a), a wafer W which has been subjected to the post baking process after completion of the developing process, is transported to the transfer arm A1, and the substrate holding part 13a holds and transfers the wafer W to a position above the TCP1 of the shelf unit U5. Then, as shown in FIG. 6(b), the substrate holding part 13a is moved downward to a position where the substrate supporting parts 13b can pass through the cutouts 13 of the cooling plate 11. At this time, at substantially the same time when the wafer W is placed on the cooling plate 11, the wafer W is sucked by the suction holes 19, such that the wafer W is brought into tight contact with the surface of the cooling plate 11 on which the wafer W is placed.

Figure 6A:
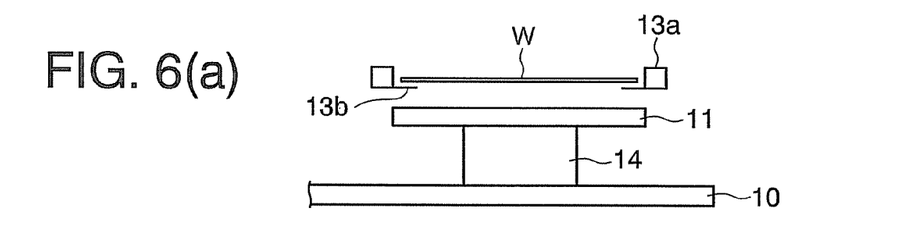
FIGS. 6(a) to 6(e) show an embodiment to which the cooling plate according to the present invention is applied.
Figure 6B:
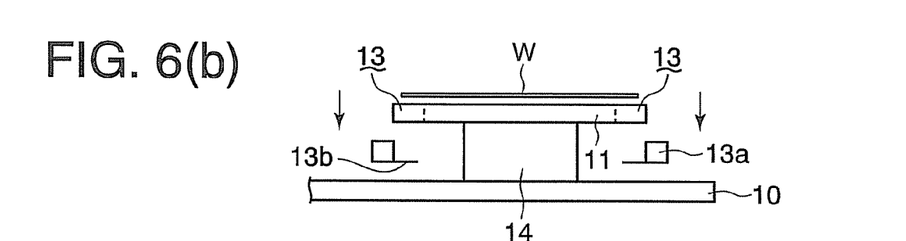

Owing to the suction to bring the wafer W into tight contact with the surface of the cooling plate 11, a cooling effect of a wafer W can be further improved. Thus, even a warped wafer W can be effectively cooled. In addition, after the wafer W has been placed, a temperature-adjusting gas is discharged from the gas discharge holes 20 toward the rear surface of the wafer and widely toward the recessed surface, in order to enhance the cooling effect. Since the temperature-adjusting channel 16 and the gas channel 15 are disposed near (adjacent) to each other in the cooling plate 11, the temperature of the temperature-adjusting fluid can become effectively close to that of the temperature-adjusting gas. Thus, an equipment for adjusting a temperature of the gas can be omitted. In addition, the suction operation is also effective in restraining a floating movement of the wafer W. However, it is not necessarily indispensable to make the wafer W be in contact with the cooling plate 11 by the suction operation or to adjust the temperature of the wafer W by the discharge of the gas. It is sufficient that the wafer W is cooled by the temperature-adjusting fluid provided in the cooling plate 11.

Figure 6C:
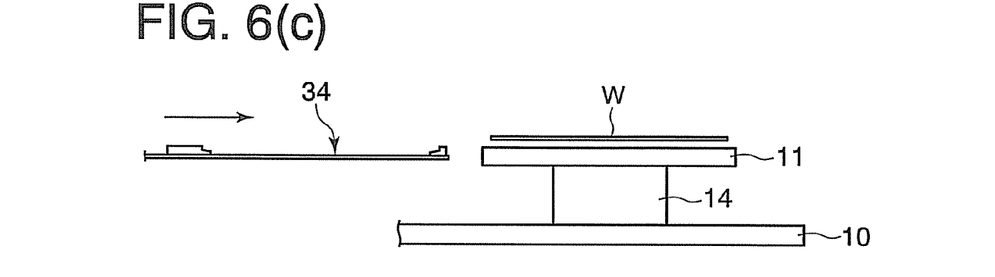
Figure 6D:
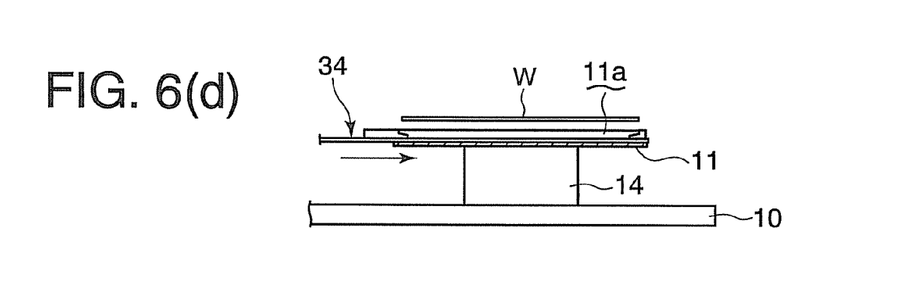

Next, the transport operation of the wafer W by the transport arm C after completion of the cooling process is described. FIG. 6(c) is a view showing a condition where the pair of tweezers 34 of the transport arm C is moved toward the cooling plate 11 so as to receive the wafer W. FIG. 6(d) is a view showing a condition where the pair of tweezers 34 enters the recess 11a of the cooling plate 11 on which the wafer W is placed. The recess 11a has a shape that is similar to and slightly larger than the substantially Y-shaped planar shape of the pair of tweezers 34. Namely, the recess 11a has such a depth and such a width that the pair of tweezers 34 are not allowed to come into contact with the wafer, when the pair of tweezers 34 enters a space between the recess 11a of the cooling plate 11 and the rear surface of the wafer placed on the cooling plate 11.

Figure 6E:
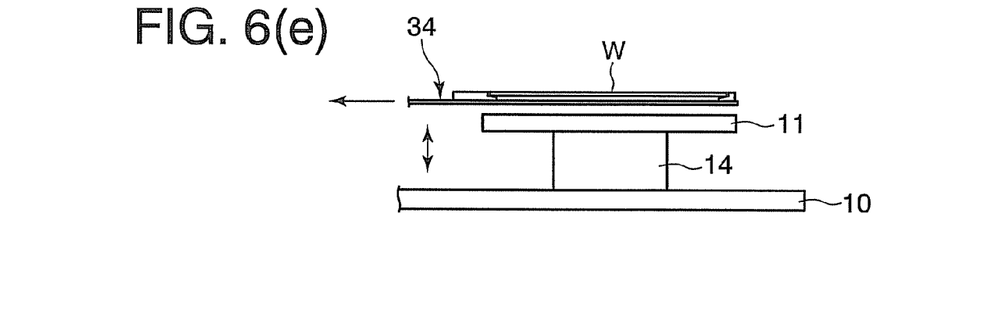

Thereafter, as shown in FIG. 6(e), the pair of tweezers 34 is moved upward at a predetermined position where the wafer on the cooling plate 11 can be received. After the wafer W has been held by the pair of tweezers 34, the pair of tweezers 34 is retracted and the wafer is housed into the carrier 70. In the manner as described above, the wafer W, which has been subjected to the cooling process, can be transported.

Since a wafer W can be sent to and received from the cooling plate 11 without any complicated mechanism, a throughput can be accelerated. In addition, malfunction of the apparatus can be restrained, and the number of parts to be adjusted can be reduced. The shape of the recess 11a in the cooling plate 11 is not limited to the illustrated shape. The recess 11a may be of any given plate-like shape which will not degrade the cooling effect of the cooling plate 11, as long as the shape enables the transport of a wafer W with a smaller occupied area. In addition, even when the transport arm C has a shape resembling two plate-like forks, the cooling effect can be achieved.

The application of the present invention is not limited to the above description. For example, the present invention may be disposed on the transport unit TRS6 provided in the shelf unit U6, by which a wafer W can be transported between the interface block S3 and the processing block S2. In this case, the present invention can be used for decreasing a temperature in a plane of a wafer, and for maintaining constant the temperature, before the PED process (post-exposure baking process) is performed. Thus, there is disposed a substrate cooling apparatus having the same structure as described above, and a wafer W is transported from the transport arm C which is the second substrate transfer means, to the transfer arm A1 which is the first substrate transfer means, in a reverse order as described above. Actually, the interface arm B places a wafer, and the transfer arm A1 receives the wafer.

Further, in the transfer arm D1 disposed on the shelf unit U5, a substrate holding part of the transfer arm D1 is formed into the same shape as that of the transfer arm A1, so that the transfer arm D1 can pass through the cutouts 13 of the cooling plate 11 in the up and down direction. Thus, the present invention can be used, for example, when a wafer W is housed into the carrier 70, after the wafer W has been subjected to a heating process (pre-baking process) after a resist coating process in the COT layer B3 for coating a resist. Moreover, the present invention may be disposed in place of the transport unit TRS1. As described above, the present invention may be disposed on a position where a throughput should be improved. The substrate holding part of the transfer arm D1 shown in FIG. 7 may have a plate-like shape, and the recess 11a may be provided as long as a shape and a size thereof do not damage the cooling function of the cooling plate 11. Also in this case, a wafer W can be transported by the conventional-type substrate support pins in another processing unit of the shelf unit U5.

The invention claimed is:

1. A substrate processing apparatus comprising:
a heating part configured to subject a substrate to a heating process;
a transport part through which a substrate is transported;
a first substrate transfer means; and
a second substrate transfer means having a plate-like substrate holding part;
wherein
the substrate, which has been subjected to the heating process by the heating part, is received and placed on the transport part, by one of the first substrate transfer means and the second substrate transfer means,
the substrate placed on the transport part is received from the transport part and transferred, by the other of the first substrate transfer means and the second substrate transfer means, and
the transport part includes:
a table having a cooling surface on which the substrate is placed;
a temperature-adjusting channel disposed in the table, through which a temperature-adjusting water is circulated for cooling the table to a temperature lower than a temperature of the heating process; and
a recess formed in the cooling surface of the table, the recess having a shape that is similar to a planar shape of the substrate holding part of the second substrate transfer means and slightly larger than the planar shape of the substrate holding part;
wherein the recess has such a depth and such a width that the substrate holding part of the second transfer means is not allowed to come into contact with the substrate, when the substrate holding part enters the recess with the substrate being placed on the table,
wherein the substrate holding part of the second substrate transfer means includes a Y-shaped member forming a curved edge, and the recess has a curved edge corresponding to the curved edge of the Y-shaped member, and
wherein the table has a circular shape and the first substrate transfer means has a circular inner edge corresponding to the circular shape of the table.

2. The substrate processing apparatus according to claim 1, wherein
the first substrate transfer means includes a plurality of substrate supporting parts for supporting a periphery of the substrate so as to hold the substrate, and
the table includes cutouts formed in a peripheral portion of the table, the cutouts allowing the substrate supporting parts to pass therethrough in an up and down direction.

3. The substrate processing apparatus according to claim 1, wherein
the table includes a suction hole for sucking the substrate when the substrate is placed on the table.

4. The substrate processing apparatus according to claim 1, wherein
a gas channel through which a gas flows is disposed inside the table, and
a plurality of gas discharge holes in communication with the gas channel are formed along a wall surface of the recess, the gas discharge holes being configured to discharge a gas for cooling a substrate placed on the table.

5. The substrate processing apparatus according to claim 4, wherein
the temperature-adjusting channel is disposed adjacent to the gas channel, and
a temperature of the gas circulating through the gas channel is adjusted by a temperature-adjusting water circulating through the temperature-adjusting channel.

6. The substrate processing apparatus according to claim 4, wherein the cooling surface of the table further comprises suction holes and,
when a gas is discharged from the gas discharge holes, the substrate is brought into tight contact with the cooling surface of the table by a suction from the suction holes.

7. The substrate processing apparatus according to claim 1, further comprising at least one coating unit for a film formation and coating process, wherein
the heating part performs the heating process after one of a developing process and a heating process after the film formation and coating process.

* * * * *